United States Patent
Couillard et al.

(10) Patent No.: US 7,268,051 B2
(45) Date of Patent: Sep. 11, 2007

(54) SEMICONDUCTOR ON GLASS INSULATOR WITH DEPOSITED BARRIER LAYER

(75) Inventors: James Gregory Couillard, Ithaca, NY (US); Kishor Purushottam Gadkaree, Big Flats, NY (US)

(73) Assignee: Corning Incorporated, Corning, NY (US)

( * ) Notice: Subject to any disclaimer, the term of this patent is extended or adjusted under 35 U.S.C. 154(b) by 125 days.

(21) Appl. No.: 11/213,130

(22) Filed: Aug. 26, 2005

(65) Prior Publication Data

US 2007/0048968 A1    Mar. 1, 2007

(51) Int. Cl.
*H01L 21/331* (2006.01)

(52) U.S. Cl. ............ 438/311; 438/455; 438/513; 438/680; 257/E21.17; 257/E21.32

(58) Field of Classification Search ............ 438/311, 438/30, 149, 197, 475, 474, 603, 604, 663, 438/692, 455, 522, 723, 743, 753, 756, 513, 438/680
See application file for complete search history.

(56) References Cited

U.S. PATENT DOCUMENTS

| | | | |
|---|---|---|---|
| 5,374,564 A | 12/1994 | Bruel | 438/455 |
| 5,854,123 A | 12/1998 | Sato et al. | 438/507 |
| 6,140,209 A | 10/2000 | Iwane et al. | 438/458 |
| 6,211,041 B1 | 4/2001 | Ogura | 438/458 |
| 6,309,950 B1 | 10/2001 | Forbes | 438/455 |
| 6,323,408 B1 | 11/2001 | Liu | 84/451 |
| 6,335,231 B1 | 1/2002 | Ohtani et al. | 438/151 |
| 6,391,740 B1 | 5/2002 | Cheung | 438/455 |
| 6,610,582 B1 | 8/2003 | Stewart | 438/455 |
| 7,176,528 B2 * | 2/2007 | Couillard et al. | 257/347 |
| 7,192,844 B2 * | 3/2007 | Couillard et al. | 438/458 |
| 7,196,898 B2 * | 3/2007 | Osaka et al. | 361/321.1 |
| 2004/0229444 A1 | 11/2004 | Couillard et al. | 438/455 |

\* cited by examiner

*Primary Examiner*—David Nhu
(74) *Attorney, Agent, or Firm*—Timothy M. Schaeberle

(57) ABSTRACT

Methods and apparatus provide for: a silicon on insulator structure, comprising: a glass substrate; a layer of semiconductor material; and a deposited barrier layer of between about 60 nm to about 600 nm disposed between the glass substrate and the semiconductor material, where the glass substrate and semiconductor material are bonded together via electrolysis.

21 Claims, 6 Drawing Sheets

SEMICONDUCTOR ON GLASS INSULATOR WITH DEPOSITED BARRIER LAYER

BACKGROUND

The present invention relates to semiconductor-on-insulator (SOI) structures and methods for making same.

To date, the semiconductor material most commonly used in semiconductor-on-insulator structures has been silicon. Such structures have been referred to in the literature as silicon-on-insulator structures and the abbreviation "SOI" has been applied to such structures. Silicon-on-insulator technology is becoming increasingly important for high performance thin film transistors, solar cells, and displays, such as, active matrix displays. Silicon-on-insulator wafers consist of a thin layer of substantially single crystal silicon (generally 0.1-0.3 microns in thickness but, in some cases, as thick as 5 microns) on an insulating material.

For ease of presentation, the following discussion will at times be in terms of silicon-on-insulator structures. The references to this particular type of semiconductor-on-insulator structure are made to facilitate the explanation of the invention and are not intended to, and should not be interpreted as, limiting the invention's scope in any way. The SOI abbreviation is used herein to refer to semiconductor-on-insulator structures in general, including, but not limited to, silicon-on-insulator structures. Similarly, the SOG abbreviation is used to refer to semiconductor-on-glass structures in general, including, but not limited to, silicon-on-glass structures. The SOG nomenclature is also intended to include semiconductor-on-glass-ceramic structures, including, but not limited to, silicon-on-glass-ceramic structures. The abbreviation SOI encompasses SOG structures.

Various ways of obtaining SOI structures wafer include epitaxial growth of Si on lattice matched substrates. An alternative process includes the bonding of a single crystal silicon wafer to another silicon wafer on which an oxide layer of $SiO_2$ has been grown, followed by polishing or etching of the top wafer down to, for example, a 0.1 to 0.3 micron layer of single crystal silicon. Further methods include ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

The former two methods have not resulted in satisfactory structures in terms of cost and/or bond strength and durability. The latter method involving hydrogen ion implantation has received some attention and has been considered advantageous over the former methods because the implantation energies required are less than 50% of that of oxygen ion implants and the dosage required is two orders of magnitude lower.

Exfoliation by the hydrogen ion implantation method typically consists of the following steps. A thermal oxide layer is grown on a single crystal silicon wafer. Hydrogen ions are then implanted into this wafer to generate subsurface flaws. The implantation energy determines the depth at which the flaws are generated and the dosage determines flaw density. This wafer is then placed into contact with another silicon wafer (the support substrate) at room temperature to form a tentative bond. The wafers are then heat-treated to about 600 degrees C. to cause growth of the subsurface flaws for use in separating a thin layer of silicon from the Si wafer. The resulting assembly is then heated to a temperature above 1,000 degrees C. to fully bond the Si film with $SiO_2$ underlayer to the support substrate, i.e., the unimplanted Si wafer. This process thus forms an SOI structure with a thin film of silicon bonded to another silicon wafer with an oxide insulator layer in between.

Cost is an important consideration for commercial applications of SOI structures. To date, a major part of the cost of the above-described method and structure has been the cost of the silicon wafer which supports the oxide layer, topped by the Si thin film, i.e., a major part of the cost has been the support substrate. Although the use of quartz as a support substrate has been mentioned in various patents (see U.S. Pat. Nos. 6,140,209 6,211,041, 6,309,950, 6,323,108, 6,335,231, and 6,391,740), quartz is itself a relatively expensive material. In discussing support substrates, some of the above references have mentioned quartz glass, glass, and glass-ceramics. Other support substrate materials listed in these references include diamond, sapphire, silicon carbide, silicon nitride, ceramics, metals, and plastics.

U.S. Pat. No. 5,374,564 discloses a process to obtain a single crystal silicon film on a substrate using a thermal process. A semiconductor material wafer having a planar face is subject to the following steps: (i) implantation by bombardment of a face of the wafer by means of ions creating a layer of gaseous micro-bubbles defining a lower region constituting the mass of the substrate and an upper region constituting the thin film; (ii) contacting the planar face of the wafer with a stiffener constituted by at least one rigid material layer; and (iii) a third stage of heat treating the assembly of the wafer and the stiffener at a temperature above that at which the ion bombardment was carried out and sufficient to create a pressure effect in the micro-bubbles and a separation between the thin film and the mass of the substrate. Due to the high temperature steps, this process does not work with lower cost glass or glass-ceramic substrates.

U.S. Patent Application No.: 2004/0229444 discloses a process that produces a SOG structure. The steps include: (i) exposing a silicon wafer surface to hydrogen ion implantation to create a bonding surface; (ii) bringing the bonding surface of the wafer into contact with a glass substrate; (iii) applying pressure, temperature and voltage to the wafer and the glass substrate to facilitate bonding therebetween; and (iv) cooling the structure to a common temperature to facilitate separation of the glass substrate and a thin layer of silicon from the silicon wafer.

It has been discovered, however, that problems can occur in the SOI structure when alkali and other ions migrate from the glass substrate into the silicon layer. The SOI formation technique disclosed in U.S. Patent Application No.: 2004/0229444 has been shown to result in a relatively thin barrier layer of silica between the silicon layer and the glass. The barrier layer of silica between the silicon layer and the glass layer is only about 200 nm or less, which is sufficient for some if not most applications. However, this barrier layer of silica may not provide a satisfactory barrier to ion migration in other applications.

SUMMARY OF THE INVENTION

In accordance with one or more embodiments of the present invention, methods and apparatus provide for a silicon on insulator structure, comprising: a glass substrate; a barrier layer of between about 100 nm to about 600 nm disposed on either the glass substrate or silicon substrate; and a layer of semiconductor material bonded to the barrier layer via electrolysis. The barrier layer is formed from at least one of silica, silicon oxynitride, zirconia, tantalum oxide, and hafnium oxide. The glass substrate may be glass, glass ceramic or any other suitable material. The semiconductor layer is preferably taken from the group consisting of: silicon (Si), germanium-doped silicon (SiGe), silicon carbide (SiC), germanium (Ge), gallium arsenide (GaAs), GaP, and InP.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION OF THE PRESENT INVENTION

Figure 1:
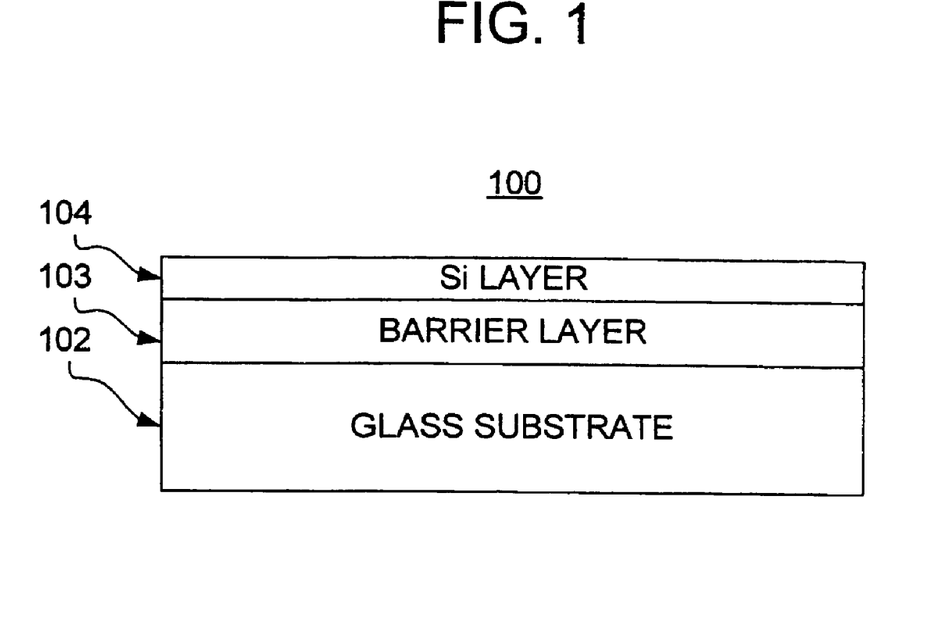
FIG. 1 is a block diagram illustrating the structure of a SOI device in accordance with one or more embodiments of the present invention.

With reference to the drawings, wherein like numerals indicate like elements, there is shown in FIG. 1 an SOG structure 100 in accordance with one or more embodiments of the present invention. The SOG structure 100 preferably includes a glass substrate 102, a barrier layer 103, and a semiconductor layer 104. The SOG structure 100 has suitable uses in connection with fabricating thin film transistors (TFTs), e.g., for display applications, including organic light-emitting diode (OLED) displays and liquid crystal displays (LCDs), integrated circuits, photovoltaic devices, etc.

The semiconductor material of the layer 104 is preferably in the form of a substantially single-crystal material. The word "substantially" is used in describing the layer 104 to take account of the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor.

For the purposes of discussion, it is assumed that the semiconductor layer 104 is formed from silicon. It is understood, however, that the semiconductor material may be a silicon-based semiconductor or any other type of semiconductor, such as, the III-V, II-IV, II-IV-V, etc. classes of semiconductors. Examples of these materials include: silicon (Si), germanium-doped silicon (SiGe), silicon carbide (SiC), germanium (Ge), gallium arsenide (GaAs), GaP, and InP.

The glass substrate 102 is preferably formed from an oxide glass or an oxide glass-ceramic. Although not required, the embodiments described herein preferably include an oxide glass or glass-ceramic exhibiting a strain point of less than about 1,000 degrees C. As is conventional in the glass making art, the strain point is the temperature at which the glass or glass-ceramic has a viscosity of $10^{14.6}$ poise ($10^{13.6}$ Pa·s). As between oxide glasses and oxide glass-ceramics, the glasses are presently preferred because they are typically simpler to manufacture, thus making them more widely available and less expensive.

By way of example, the glass substrate 102 may be formed from glass substrates containing alkaline-earth ions, such as, substrates made of CORNING INCORPORATED GLASS COMPOSITION NO. 1737 or CORNING INCORPORATED GLASS COMPOSITION NO. EAGLE 2000™. These glass materials have particular use in, for example, the production of liquid crystal displays.

The glass substrate preferably has a thickness in the range of about 0.1 mm to about 10 mm and most preferably in the range of about 0.5 mm to about 1 mm. For some SOI structures, insulating layers having a thickness greater than or equal to about 1 micron are desirable, e.g., to avoid parasitic capacitive effects which arise when standard SOI structures having a silicon/silicon dioxide/silicon configuration are operated at high frequencies. In the past, such thicknesses have been difficult to achieve. In accordance with the present invention, an SOI structure having an insulating layer thicker than about 1 micron is readily achieved by simply using a glass substrate 102 having a thickness that is greater than or equal to about 1 micron. A preferred lower limit on the thickness of the glass substrate 102 is thus about 1 micron.

In general, the glass substrate 102 should be thick enough to support the barrier layer 103 and the semiconductor layer 104 through the process steps of the invention, as well as subsequent processing performed on the SOG structure 100. Although there is no theoretical upper limit on the thickness of the glass substrate 102, a thickness beyond that needed for the support function or that desired for the ultimate SOG structure 100 is generally not preferred since the greater the thickness of the glass substrate 102, the more difficult it will be to accomplish at least some of the process steps in forming the SOG structure 100.

The oxide glass or oxide glass-ceramic substrate 102 is preferably silica-based. Thus, the mole percent of $SiO_2$ in the oxide glass or oxide glass-ceramic is preferably greater than 30 mole % and most preferably greater than 40 mole %. In the case of glass-ceramics, the crystalline phase can be mullite, cordierite, anorthite, spinel, or other crystalline phases known in the art for glass-ceramics. Non-silica-based glasses and glass-ceramics may be used in the practice of one or more embodiments of the invention, but are generally less preferred because of their higher cost and/or inferior performance characteristics. Similarly, for some applications, e.g., for SOI structures employing semiconductor materials that are not silicon-based, glass substrates which are not oxide based, e.g., non-oxide glasses, may be desirable, but are generally not preferred because of their higher cost.

For certain applications, e.g., display applications, the glass or glass-ceramic 102 is preferably transparent in the visible, near UV, and/or IR wavelength ranges, e.g., the glass or glass ceramic 102 is preferably transparent in the 350 nm to 2 micron wavelength range.

Although the glass substrate 102 is preferably composed of a single glass or glass-ceramic, laminated structures can be used if desired. When laminated structures are used, the layer of the laminate closest to the semiconductor layer 104 preferably has the properties discussed herein for a glass substrate 102 composed of a single glass or glass-ceramic.

Layers farther from the semiconductor layer 104 preferably also have those properties, but may have relaxed properties because they do not directly interact with the semiconductor layer 104. In the latter case, the glass substrate 102 is considered to have ended when the properties specified for a glass substrate 102 are no longer satisfied.

Figure 2:
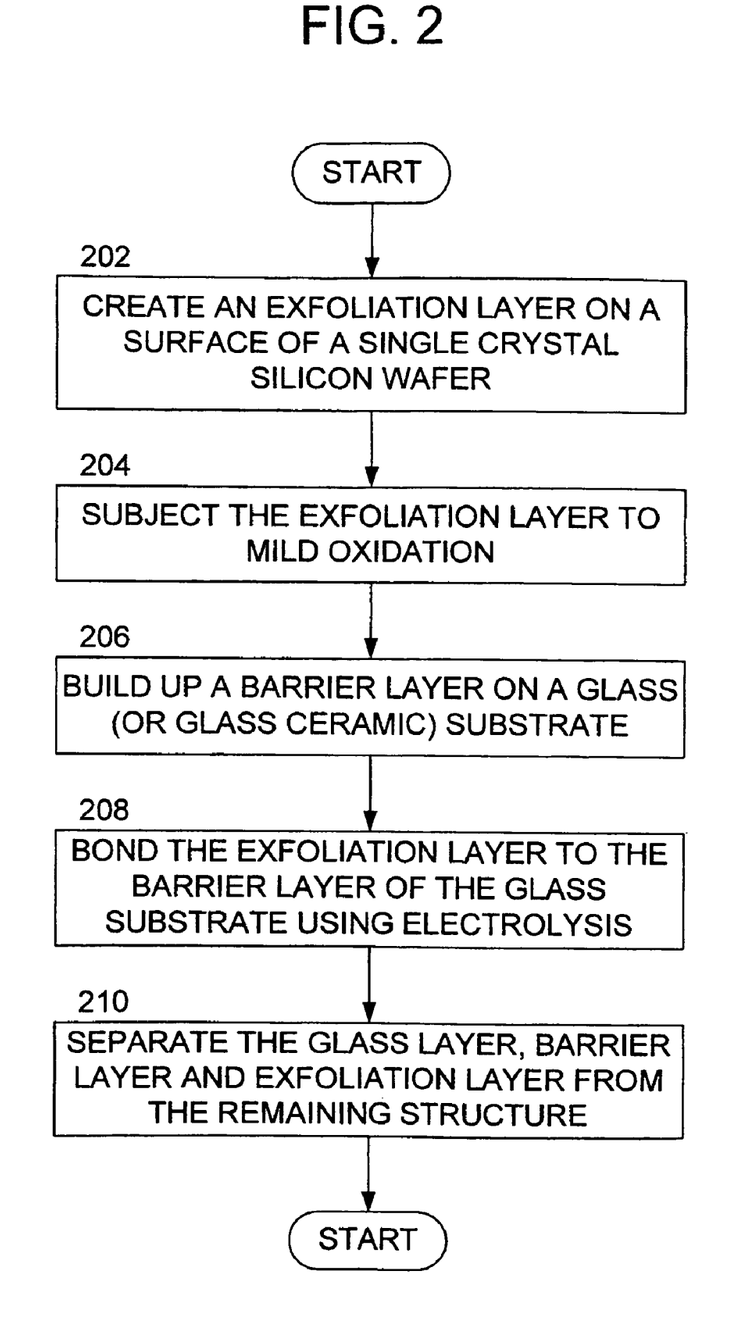
FIG. 2 is a flow diagram illustrating process steps that may be carried out to produce the SOI structure of FIG. 1 when a barrier layer is deposited on glass substrate.
Figure 3A:
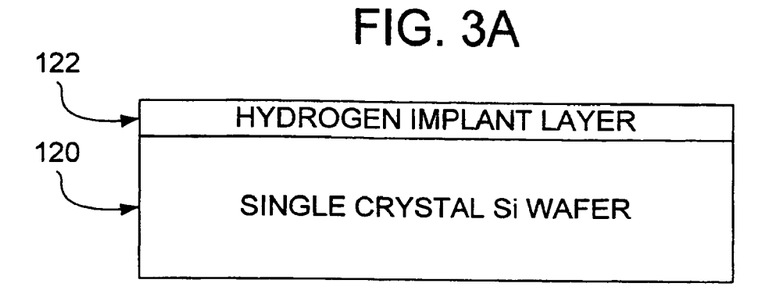
FIGS. 3A-3B are block diagrams illustrating a process of forming the SOI structure of FIG. 1 using the process of FIG. 2.
Figure 3B:
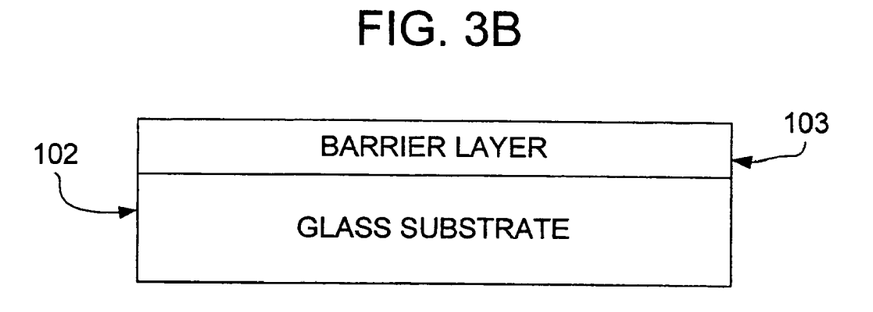

Reference is now made to FIGS. 2 and 3A-3B, which illustrate process steps that may be carried out in order to produce an intermediate structure in connection with fabricating the SOG structure 100 of FIG. 1. At action 202, an exfoliation layer 122 is formed on a surface of the semiconductor wafer 120 (FIG. 3A). For the purposes of discussion, the semiconductor wafer 120 is preferably a substantially single crystal Si wafer, although as discussed above any other suitable semiconductor conductor material may be employed.

The exfoliation layer 122 is preferably a relatively thin layer of silicon that may be separated from the semiconductor wafer 120 (which will be discussed later herein). Although the embodiments of the present invention are not limited to any particular method of forming the exfoliation layer, one suitable method includes the use of ion implantation to create a weakened region below the surface of the silicon wafer 120. By way of example, hydrogen ion implantation may be employed, although other ions or multiples thereof may be employed, such as boron+hydrogen, helium+hydrogen, or other ions known in the literature for exfoliation. Again, any other known or hereinafter developed technique suitable for forming the exfoliation layer 122 may be employed without departing from the spirit and scope of the present invention.

No matter what technique is employed to create the exfoliation layer 122, the silicon wafer 120 is preferably treated to reduce the (e.g., hydrogen) ion concentration on the surface. For example, at action 204, the semiconductor wafer 120 is preferably washed and cleaned and the exfoliation layer 122 is preferably subject to mild oxidation. The mild oxidation treatments may include treatment in oxygen plasma, ozone treatments, treatment with hydrogen peroxide, hydrogen peroxide and ammonia, hydrogen peroxide and an acid or a combination of these processes. It is expected that during these treatments hydrogen terminated surface groups oxidize to hydroxyl groups, which in turn also makes the surface of the silicon wafer hydrophilic. The treatment is preferably carried out at room temperature for the oxygen plasma and at temperature between 25-150° C. for the ammonia or acid treatments.

Referring to FIGS. 2 and 3B, at action 206, a barrier layer 103 is preferably formed directly or indirectly on the glass substrate 102. The barrier layer 103 is preferably formed from one or more of: silica, silicon oxynitride, zirconia, tantalum oxide, and hafnium oxide, although other suitable materials may be employed. The barrier layer 103 is preferably created via chemical vapor deposition (which may be a plasma enhanced process), sputtering, e-beam evaporation, thermal evaporation, or other suitable processes. The thickness of the barrier layer 103 may be between about 50 nm to about 600 nm, although other thicknesses including greater thicknesses may be employed depending on the particular application of the structure 100. It is desirable, however, that the thickness of the barrier layer significantly impede migration of ions from the glass substrate 102 into the silicon layer 104. It is noted that the barrier layer 103 may be established as an additional layer to any in situ barrier layer(s) that may be formed during the process of fabricating the SOG structure 100.

For example, at action 208, the glass substrate/barrier layer combination 102, 122 is preferably bonded to the exfoliation layer 122 using an electrolysis process. Although the details of a preferred electrolysis process will be discussed later in this description with reference to FIG. 6, it is noted here that the electrolysis process described above with respect to U.S. Patent Application No.: 2004/0229444 may be employed. This process may produce an in situ layer of, for example, silica on the exfoliation layer 122. In accordance with one or more embodiments of the present invention, the barrier layer 103 is an additional layer that is deposited (or grown) to act independently of or cooperatively with the in situ layer of silica (if any).

Figure 4:
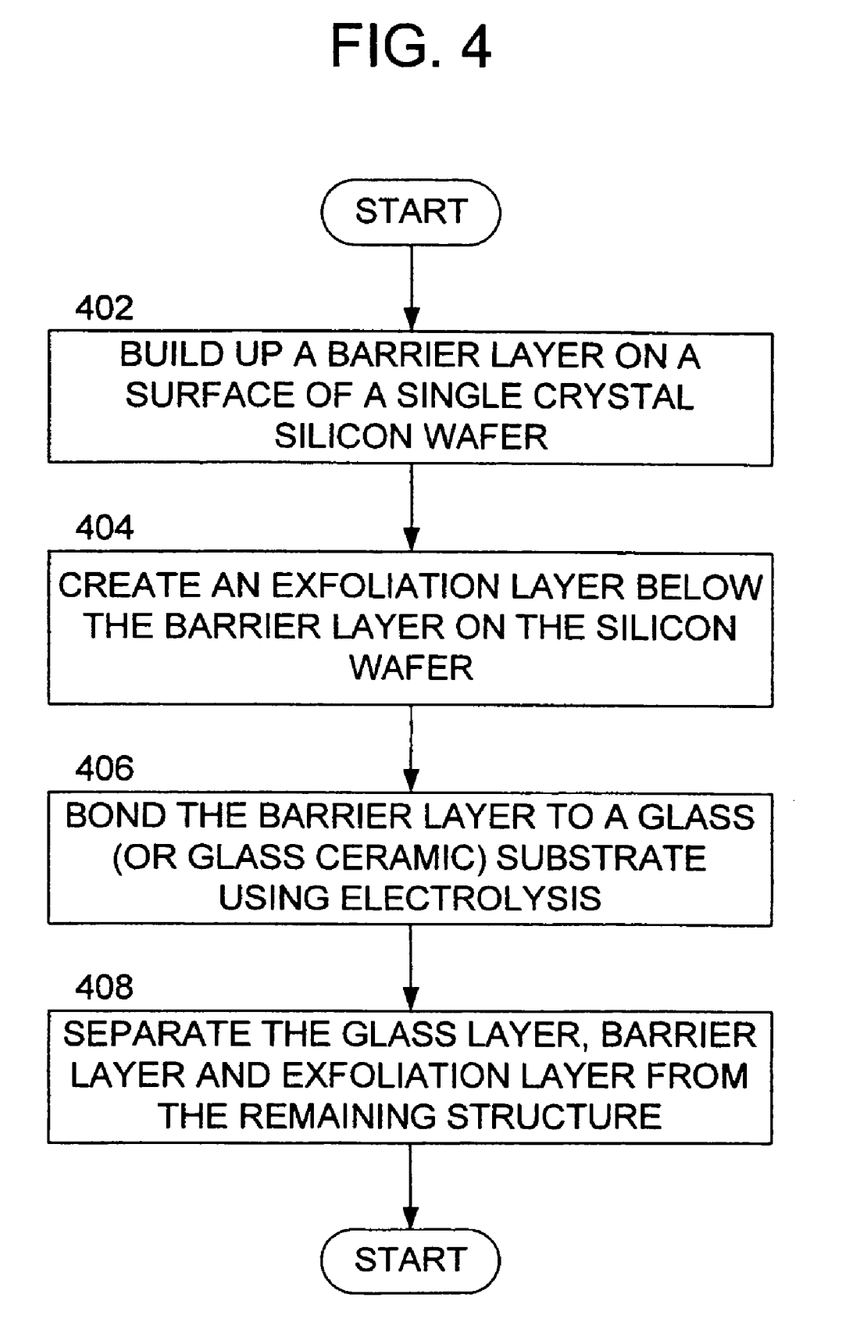
FIG. 4 is a flow diagram illustrating process steps that may be carried out to produce the SOI structure of FIG. 1 when a barrier layer is disposed on the silicon wafer.
Figure 5A:
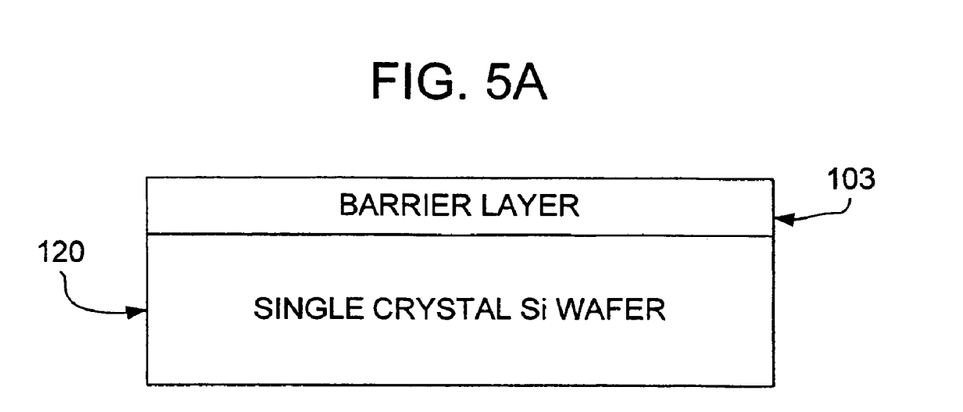
FIGS. 5A-5B are block diagrams of forming the SOI structure using the process of FIG. 4.
Figure 5B:
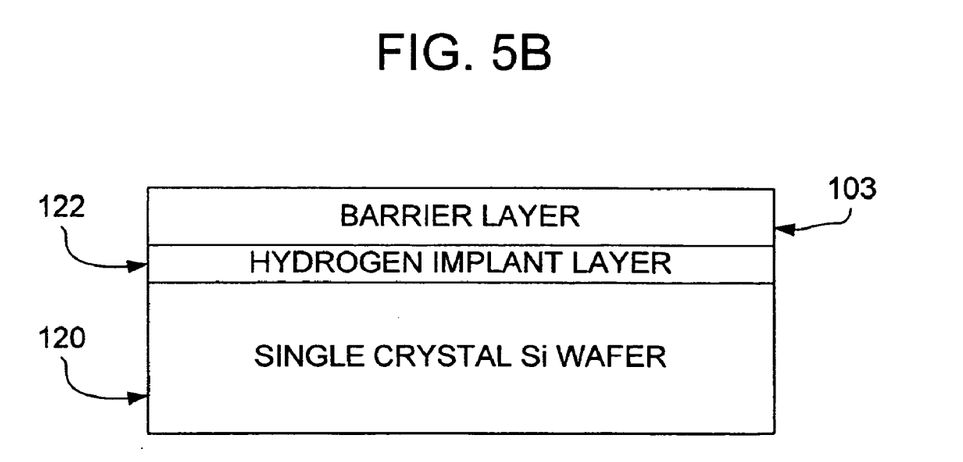

Prior to discussing the details of bonding the glass substrate/barrier layer combination 102, 122 to the exfoliation layer 122, an alternative process of providing the barrier layer 103 will be described. FIGS. 4 and 5A-5B process steps that may be carried out in order to produce an alternative intermediate structure in connection with fabricating the SOG structure 100 of FIG. 1. In this embodiment, the barrier layer 103 is deposited or created directly or indirectly on the silicon wafer 120 instead of on the glass substrate 102. With reference to FIGS. 4 and 5A, at action 402 the barrier layer 103 is deposited or created on the silicon wafer 120 using any of the known deposition techniques. For example, thermal oxidation, CVD, sol-gel, sputtering, etc. may be employed to deposit the barrier layer 103 on the wafer 120. Again, the barrier layer 103 is preferably formed from one or more of: silica, silicon oxynitride, zirconia, tantalum oxide, and hafnium oxide, although other suitable materials may be employed. Further, the thickness of the barrier layer may be between about 50 nm to about 600 nm, although other thicknesses including greater thicknesses may be employed depending on the particular application of the structure 100 so long as the thickness of the barrier layer significantly impedes migration of ions from the glass substrate 102 into the silicon layer 104 after bonding (which is described later).

At action 404, an exfoliation layer 122 is formed below the barrier layer 103 and below a surface of the semiconductor wafer 120. The exfoliation layer 122 is preferably a relatively thin layer of silicon that may be separated from the semiconductor wafer 120. Although the embodiments of the present invention are not limited to any particular method of forming the exfoliation layer 122, one suitable method includes the use of ion implantation to create a weakened region below the surface of the silicon wafer 120. By way of example, hydrogen ion implantation may be employed, although other ions or multiples thereof may be employed, such as boron+hydrogen, helium+hydrogen, or other ions known in the literature for exfoliation.

At action 406, the glass substrate 102 is preferably bonded to the barrier layer 104 using an electrolysis process.

A further alternative embodiment of the present invention contemplates a combination of the processes of FIGS. 2 and 4. In particular, a first barrier layer may be deposited on the glass substrate 102 (as in FIG. 3B) and a second barrier layer may be deposited on the silicon wafer 120 (as in FIGS. 5A-5B). Thereafter, the first and second barrier layers of the respective structures may be bonded directly or indirectly together using electrolysis.

Figure 6:
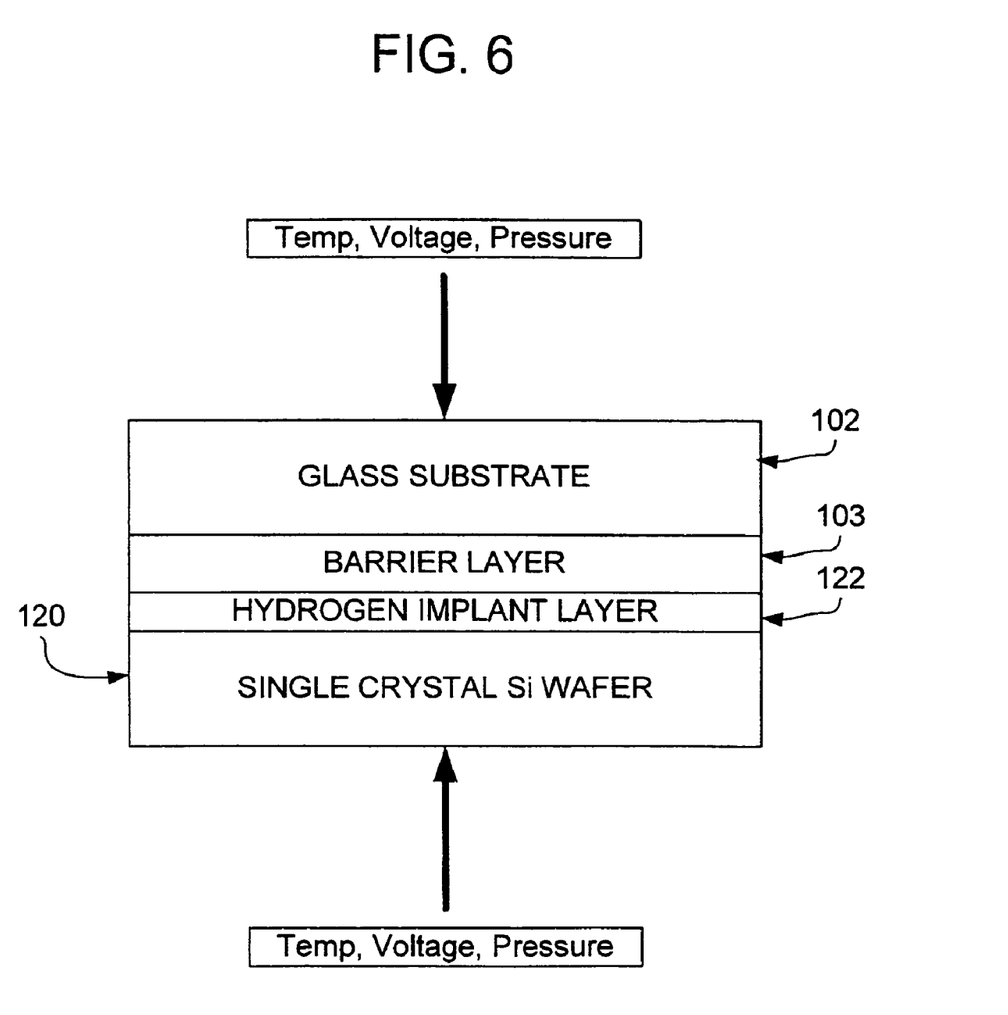
FIG. 6 is a block diagram illustrating a process of bonding a glass substrate to the intermediate structure of FIG. 3.

Irrespective of whether the process of FIG. 2, the process of FIG. 4, or a combination thereof is used to produce intermediate structures with barrier layer(s), with reference to FIG. 6, the respective structures are preferably bonded together using an electrolysis process. A preferred electrolysis bonding process is described in U.S. Patent Application No. 2004/0229444, the entire disclosure of which is hereby incorporated by reference. Portions of this process are discussed below.

Irrespective of which approach is employed to produce the barrier layer(s) 103, appropriate surface cleaning is preferably carried out. Thereafter, the intermediate structures are brought into direct or indirect contact to achieve the arrangement schematically illustrated in FIG. 6. Prior to or after the contact, the structure(s) comprising the semiconductor wafer 120, the exfoliation layer 122, the barrier layer(s) 103, and the glass substrate 102 are heated under a differential temperature gradient. Preferably the glass substrate 102 (and barrier layer 130 if the structure of FIG. 3 is employed) is heated to a higher temperature than the semiconductor wafer 120 and exfoliation layer 122 (and barrier layer 130 if the structure of FIG. 5B is employed). By way of example, the temperature difference between the glass substrate 102 (and any associated layers) and the semiconductor wafer 120 (and any associated layers) is at least 1 degree C., although the difference may be as high as about 100 to about 150 degrees C. This temperature differential is desirable for a glass having a coefficient of thermal expansion (CTE) matched to that of silicon since it facilitates later separation of the exfoliation layer 122 from the semiconductor wafer 120 due to thermal stresses.

Once the temperature differential between the glass substrate 102 and the semiconductor wafer 120 is stabilized, mechanical pressure is applied to the intermediate assembly. The preferred pressure range is between about 1 to about 50 psi. Application of higher pressures, e.g., pressures above 100 psi, might cause breakage of the glass wafer.

The glass substrate 102 and the semiconductor wafer 120 are preferably taken to a temperature within about +/−150 degrees C. of the strain point of the glass substrate 102.

Next, a voltage is applied across the intermediate assembly, preferably with the semiconductor wafer 120 at the positive electrode and the glass substrate 102 the negative electrode. The application of the voltage potential causes alkali or alkaline earth ions in the glass substrate 102 to move away from the semiconductor/glass interface further into the glass substrate 102. This accomplishes two functions: (i) an alkali or alkaline earth ion free interface is created; and (ii) the glass substrate 102 becomes very reactive and bonds to the semiconductor layer 104 strongly with the application of heat at relatively low temperatures.

At action 210, FIG. 2 and action 408, FIG. 4, after the intermediate assembly is held under these conditions for some time (e.g., approximately 1 hr or less), the voltage is removed and the intermediate assembly is allowed to cool to room temperature. The semiconductor wafer 120 and the glass substrate 102 are then separated, which may include some peeling if they have not already become completely free, to obtain a glass substrate 102 with a thin semiconductor layer 104 bonded thereto.

The separation is preferably accomplished via fracture of the exfoliation layer 122 due to thermal stresses. Alternatively or in addition, mechanical stresses such as water jet cutting or chemical etching may be used to facilitate the separation.

As illustrated in FIG. 1, after separation, the resulting structure may include the glass substrate 102, the barrier layer 103, and the semiconductor layer 104 bonded thereto. Any unwanted semiconductor material may be removed via polishing techniques, e.g., via CMP or other techniques known in the art to obtain the single crystal silicon layer 104 on the glass substrate 102.

It is noted that the semiconductor wafer 120 may be reused to continue producing other SOG structures 100.

Advantageously the deposited and controlled thickness of the barrier layer 103 prevents alkali and other ions from migrating from the glass substrate 102 into the silicon layer 104. The deposition of the barrier layer 103 can be controlled as to thickness versus the in situ formed barrier layers, thereby providing a greater barrier to diffusion. The barrier layer 103 may also be composed of materials which are inherently better barriers to diffusion than silica, such as silicon oxynitride or tantalum oxide. Further, the barrier layer 103 composition can be selected for its mechanical properties, such as minimizing coefficient of thermal expansion (CTE) mismatch and/or film stress. The barrier layer 103 composition can also be selected to improve performance of devices made from the silicon film, for example by minimizing charge trapping or providing a low recombination velocity surface. A deposited barrier film 103 may also provide a barrier layer in regions where the silicon film is not transferred. Examples include the center of a substrate after selective bonding of silicon to only the periphery, or in the gaps between tiles when the silicon is tiled to cover a large area substrate.

EXAMPLE 1

A silicon wafer of 100 mm diameter and 100 microns thick was hydrogen ion implanted at a dosage of $8 \times 10^{16}$ ions/cm$^2$ and an implantation energy of 100 KeV. The wafer was then treated in oxygen plasma to oxidize the surface groups. An EAGLE glass wafer of 100 mm diameter was then cleaned and coated with 200 nm of silica via a standard PECVD process to form a deposited barrier layer. The two wafers were then inserted into a Süss MicroTec SB6 bonder. The glass wafer was placed on the negative electrode and the silicon wafer was placed on the positive electrode and held away from the glass wafer with spacers. The two wafers were brought into contact and then heated to 525° C. (silicon wafer) and 575° C. (glass wafer) in a vacuum. A potential of 1750 Volts was applied across the wafer surface. The voltage was applied for 20 minutes, at the end of which the voltage was brought to zero and the wafers were cooled to room temperature. The wafers could be separated easily. An excellent quality sample with strongly adhered thin silicon layer (500 nm) on the coated glass wafer was obtained via this process. The quality of the bond was determined via visual inspection and attempts to peel apart the structure at the bond. This example shows that an additional silica barrier layer of 200 nm may be used in the process without negatively impacting bond formation.

EXAMPLE 2

The experiment of Example 1 was repeated, except that the silica barrier layer thickness was increased to 500 nm. In this experiment, the silicon layer bond to the coated glass wafer was again successfully demonstrated via visual inspection and mechanical testing.

EXAMPLE 3

The experiment of Example 2 was repeated but in this case 100 nm of zirconium oxide was sputter coated onto the glass wafer to produce the barrier layer. The silicon layer bond was again successfully demonstrated via visual inspection and mechanical testing.

EXAMPLE 4

The experiment of Example 3 was repeated except with 100 nm of tantalum oxide sputter coating on the glass to produce the barrier layer. Transfer and bonding of the silicon layer to the coated glass wafer was again successfully demonstrated via visual inspection and mechanical testing.

EXAMPLE 5

The experiment of Example 2 was repeated using 200 nm of silicon oxynitride deposited by plasma enhanced chemical vapor deposition (PECVD) to produce the barrier layer. Again the silicon layer was successfully transferred and bonded in this case.

EXAMPLE 6

The experiment of Example 1 was repeated except that the barrier layer of 100 nm was grown on the silicon wafer via thermal oxidation followed by hydrogen implantation through the barrier layer. No barrier layer was deposited on the glass substrate. The glass wafer and the silicon wafer with barrier layer were then brought into contact and the bonding process carried out as described in Example 1. Successful transfer and bonding of the silicon layer (with the barrier layer) to the glass wafer was accomplished and successfully demonstrated via visual inspection and mechanical testing.

These examples show that an additional oxide or non-oxide barrier layer may be introduced between the glass wafer and silicon film to provide added ion migration resistance or other product enhancements without affecting the silicon layer transfer process.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a semiconductor on glass structure, comprising:
   depositing one or more barrier layers of between about 60 nm to about 600 nm total thickness directly or indirectly on at least one of a glass substrate and a semiconductor wafer;
   creating an exfoliation layer in the semiconductor wafer;
   forming an intermediate structure including the semiconductor wafer, the exfoliation layer, the one or more barrier layers, and the glass substrate;
   bonding the intermediate structure using an electrolysis process; and
   applying stress to the exfoliation layer such that the bonded glass substrate, barrier layer and exfoliation layer separates from the semiconductor wafer.

2. The method of claim 1, wherein the step of forming a barrier layer on at least one of the glass substrate and the semiconductor wafer includes coating at least one of the glass substrate and the semiconductor wafer with a barrier material using chemical vapor deposition.

3. The method of claim 2, wherein the chemical vapor deposition is plasma enhanced.

4. The method of claim 1, wherein the step of forming a barrier layer includes coating at least one of the glass substrate and the semiconductor wafer with at least one of silica, silicon oxynitride, zirconia, tantalum oxide, and hafnium oxide.

5. The method of claim 1, wherein the step of creating the exfoliation layer includes performing ion implantation to create an area of weakening below a surface of the semiconductor wafer.

6. The method of claim 5, further comprising subjecting the exfoliation layer to oxidization before bonding same to the barrier layer.

7. The method of claim 6, wherein the oxidizing step is carried out at a temperature of between about 25 degrees C. to about 150 degrees C.

8. The method of claim 1, wherein the step of bonding includes:
   heating at least one of the glass substrate and the semiconductor wafer;
   bringing the glass substrate into direct or indirect contact with the semiconductor wafer through the exfoliation layer and the one or more barrier layers; and
   applying a voltage potential across the glass substrate and the semiconductor wafer to induce the bond.

9. The method of claim 8, wherein the temperature of the glass substrate and the semiconductor wafer are elevated to within about 150 degrees C. of the strain point of the glass substrate.

10. The method of claim 9, wherein the temperatures of the glass substrate and the semiconductor wafer are elevated to different levels.

11. The method of claim 8, wherein the voltage potential across the glass substrate and the semiconductor wafer is between about 100 to 2000 volts.

12. The method of claim 1, wherein the stress is induced by cooling the bonded glass substrate, exfoliation layer, and semiconductor wafer such that a fracture occurs substantially at the exfoliation layer.

13. The method of claim 12, further comprising providing mechanical stress to facilitate the separation.

14. The method of claim 12, wherein the separation results in a structure including the glass substrate, the barrier layer and the exfoliation layer.

15. The method of claim 14, further comprising polishing the exfoliation layer to form the semiconductor on glass structure.

16. The method of claim 1, wherein the semiconductor wafer is taken from the group consisting of: silicon (Si), germanium-doped silicon (SiGe), silicon carbide (SiC), germanium (Ge), gallium arsenide (GaAs), GaP, and InP.

17. The method of claim 1, wherein the exfoliation layer is created in the semiconductor wafer below the barrier layer.

18. The method of claim 17, wherein the step of forming a barrier layer on the semiconductor wafer includes coating the semiconductor wafer with a barrier material using at least one of thermal oxidation, chemical vapor deposition, sol-gel, and sputtering.

19. The method of claim 17, wherein the barrier layer includes at least one of silica, silicon oxynitride, zirconia, tantalum oxide, and hafnium oxide.

20. The method of claim 17, wherein the step of creating the exfoliation layer includes performing ion implantation to create an area of weakening below a surface of the semiconductor wafer and below the barrier layer.

21. The method of claim 17, wherein the step of bonding includes:

heating at least one of the glass substrate and the semiconductor wafer;

bringing the glass substrate into direct or indirect contact with the semiconductor wafer through the exfoliation layer and the one or more barrier layers; and applying a voltage potential across the glass substrate and the semiconductor wafer to induce the bond.

* * * * *